United States Patent
Koyama et al.

(10) Patent No.: US 7,501,625 B2
(45) Date of Patent: Mar. 10, 2009

(54) ELECTRON MICROSCOPE APPLICATION APPARATUS AND SAMPLE INSPECTION METHOD

(75) Inventors: Hikaru Koyama, Kodaira (JP); Hiroshi Makino, Kokubunji (JP); Mitsugu Sato, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 473 days.

(21) Appl. No.: 11/442,566

(22) Filed: May 30, 2006

(65) Prior Publication Data

US 2006/0289755 A1 Dec. 28, 2006

(30) Foreign Application Priority Data

May 31, 2005 (JP) ............................. 2005-158282

(51) Int. Cl.
*G21K 7/00* (2006.01)
(52) U.S. Cl. .................... 250/311; 250/306; 250/400; 250/310; 250/398; 250/399; 324/765; 324/751; 324/752
(58) Field of Classification Search ................. 250/306, 250/307, 310, 311, 398, 399, 400; 324/765, 324/751, 752
See application file for complete search history.

(56) References Cited

U.S. PATENT DOCUMENTS

| | | | | |
|---|---|---|---|---|
| 5,004,919 A | * | 4/1991 | Kondo | .......................... 250/311 |
| 5,030,908 A | * | 7/1991 | Miyoshi et al. | ............... 324/752 |
| 5,286,974 A | * | 2/1994 | Walker et al. | ................ 250/305 |
| 5,412,209 A | * | 5/1995 | Otaka et al. | .................. 250/310 |
| 6,504,393 B1 | | 1/2003 | Lo et al. | |
| 6,979,819 B2 | * | 12/2005 | Adler et al. | .................. 250/307 |
| 2002/0104964 A1 | * | 8/2002 | Adler et al. | .................. 250/307 |
| 2005/0045821 A1 | | 3/2005 | Noji et al. | |
| 2005/0190310 A1 | * | 9/2005 | Koyama et al. | ................ 349/5 |
| 2006/0163480 A1 | * | 7/2006 | Koyama et al. | .............. 250/310 |

FOREIGN PATENT DOCUMENTS

| | | | |
|---|---|---|---|
| JP | 03012928 A | * | 1/1991 |
| JP | 11-121561 | | 4/1999 |
| JP | 2002-524827 | | 8/2002 |
| JP | 2004-363085 | | 12/2004 |
| JP | 2005/164451 | | 6/2005 |

* cited by examiner

*Primary Examiner*—Jack I Berman
*Assistant Examiner*—Michael J Logie
(74) *Attorney, Agent, or Firm*—Mattingly, Stanger, Malur & Brundidge, P.C.

(57) ABSTRACT

A charge control electrode emitting photoelectrons is disposed just above a wafer (sample) in parallel thereto, and the electrode has a through hole so that ultraviolet light can be irradiated to the wafer through the charge control electrode. Specifically, a metal plate which is formed in mesh or includes one or plural holes is used as the charge control electrode. By disposing the charge control electrode just above the sample in parallel thereto, when negative voltage is applied to the electrode, electric field approximately perpendicular to the wafer is generated. Therefore, photoelectrons are efficiently absorbed in the wafer. Also, by using the charge control electrode having approximately the same size as that of the wafer, charges on a whole surface of the wafer can be removed collectively and uniformly. Therefore, time required for the process can be reduced.

14 Claims, 18 Drawing Sheets

CHARGE CONTROL ELECTRODE VOLTAGE

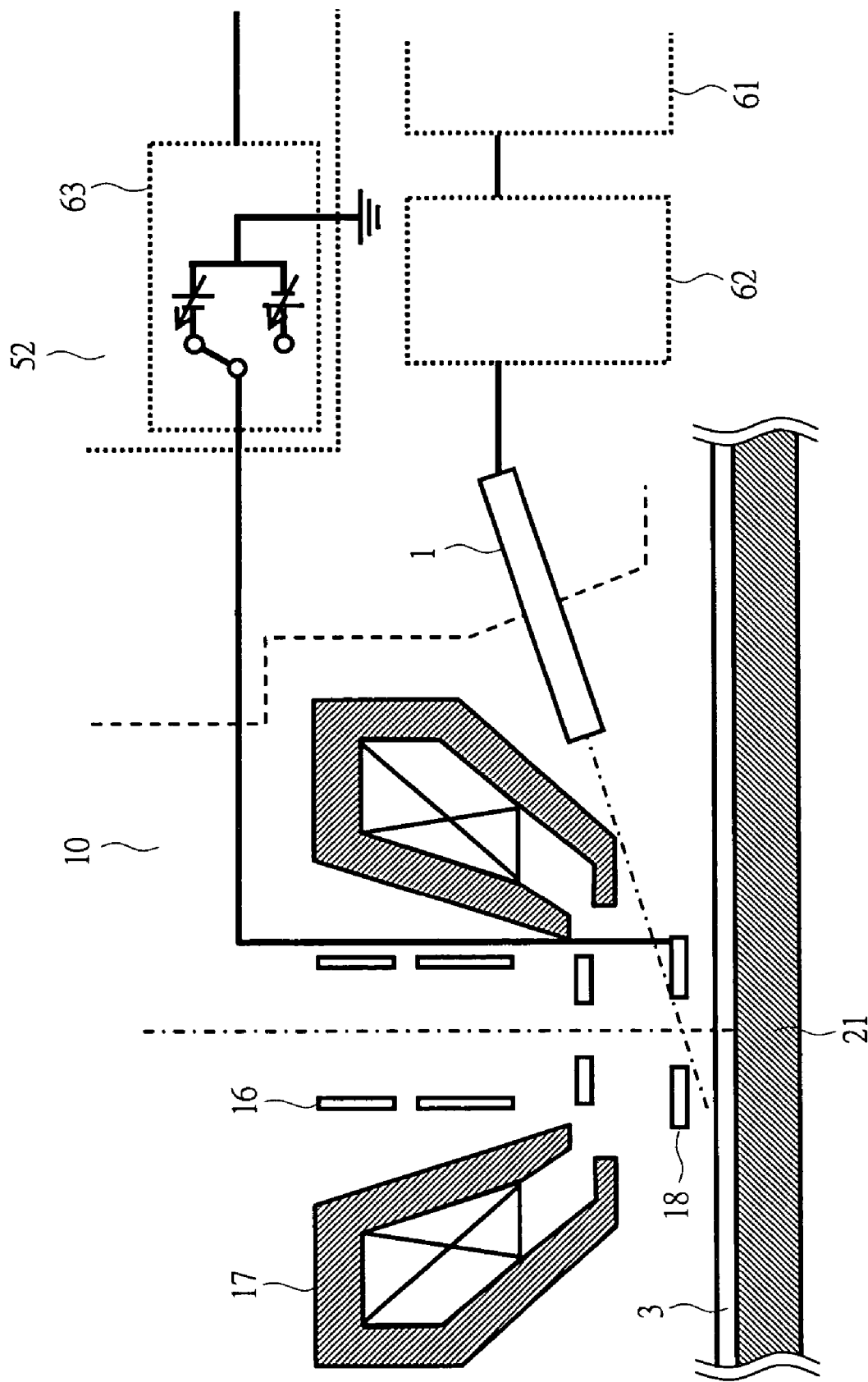

ELECTRON MICROSCOPE APPLICATION APPARATUS AND SAMPLE INSPECTION METHOD

CROSS-REFERENCE TO RELATED APPLICATION

The present application claims priority from Japanese Patent Application No. JP 2005-158282 filed on May 31, 2005, the content of which is hereby incorporated by reference into this application.

TECHNICAL FIELD OF THE INVENTION

The present invention relates to an electron microscope application apparatus and a sample inspection method. In particular, it relates to a technology effectively applied to an apparatus and a method for controlling a surface potential of a sample whose surface is covered with insulating material such as a semiconductor device or an insulating substrate and a measuring apparatus and a measuring method for a semiconductor device or an insulating substrate provided with a charge-control device.

BACKGROUND OF THE INVENTION

As a technology studied by the inventors of the present invention, for example, the following technologies are known in the field of an electron microscope application apparatus and a sample inspection method.

Currently, in a manufacturing line for silicon devices, it is essential to inspect a wafer during a manufacturing process. This is because the inspection of a wafer during the manufacturing process can find the defect in an early stage and obtain the information for specifying a process causing the defect. By feeding back the inspection results to process conditions, the number of defects can be reduced, the number of chips obtained from one wafer can be increased, and yield can be improved.

As an apparatus for inspecting a wafer to find defects in the wafer, an optical inspection apparatus and an electron beam inspection apparatus are principally used. The optical inspection apparatus is an optical microscope in principle and can find shape defects such as particles and pattern defects. However, minute shape defects and electrical defects which cannot be detected by the optical inspection apparatus have become problems due to the development in finer design rule. Therefore, attention has been paid to an electron beam inspection apparatus which can detect the defects which cannot be detected by the optical inspection apparatus, and the electron beam inspection apparatus has been developed in several makers.

The detection of electrical defect in a silicon device by using the electron beam inspection apparatus is performed by charging a circuit pattern formed on a wafer surface and inspecting the contrast elicited by the charging. This process is called "voltage contrast method", which is effective means for detecting electrical defect in a silicon device. In order to perform the inspection using the voltage contrast method with excellent reproducibility and high precision, it is necessary to control the charges of a circuit pattern to be inspected at high precision, and the improvement in control precision is directly linked to the improvement in detection precision for electrical defect.

As a method for controlling the charges of a wafer surface, a method based on electron beam irradiation and a method based on ultraviolet light irradiation have been disclosed (for example, Japanese Unexamined Patent Publication No. 2002-524827 (Patent Document 1) and Japanese Patent Application Laid-Open Publication No. 11-121561 (Patent Document 2)). In both the methods, electron beam or ultraviolet light is irradiated onto an area larger than an area observed in the case of using an electron beam inspection apparatus and the charges are made uniform.

Also, a method for removing the charges generated by the electron beam observation has been disclosed (for example, Japanese Patent Application Laid-Open Publication No. 2004-363085 (Patent Document 3)). In the Patent Document 3, charges of a sample are removed or made uniform by irradiating ultraviolet light onto metal so as to irradiate photoelectrons emitted by photoelectric effect onto the sample instead of directly irradiating ultraviolet light onto the sample.

SUMMARY OF THE INVENTION

However, the following matters regarding the above technologies have been found through the examinations by the inventors of the present invention.

For example, the Patent Document 3 discloses a method for removing the charges of a sample by irradiating ultraviolet light onto an electrode so as to absorb photoelectrons emitted from the electrode to the sample.

In this method, however, there is a problem of a processing rate and control precision of the charges.

First, regarding the processing rate, since an electrode from which photoelectrons are emitted is spaced away from a sample in the method disclosed in Patent Document 3, a ratio of photoelectrons which are not absorbed in the sample becomes high. Since a rate for removing the charges is proportional to the number of photoelectrons absorbed in the sample, it is necessary to consider a distance between the electrode and the sample in order to improve the processing rate. Also, regarding the controllability on charges, since a negative voltage for the sample is applied to the electrode in the Patent Document 3, a sample surface is charged up to the voltage applied to the electrode. When the charges on the sample surface are to be removed or the potential of the sample surface is to be reduced to 0 V, a mechanism for controlling the charges has to be additionally provided. Further, it is difficult to positively charge a sample in principle.

Therefore, an object of the present invention is to provide a technology capable of controlling the charges of a sample in an electron microscope application apparatus and a sample inspection method.

The above and other objects and novel characteristics of the present invention will be apparent from the description of this specification and the accompanying drawings.

The typical ones of the inventions disclosed in this application will be briefly described as follows.

In order to solve the problem described above, in an electron microscope application apparatus according to the present invention, an electrode for emitting photoelectrons is disposed just above a sample and in parallel thereto, and the electrode has a through-hole so that ultraviolet light can be irradiated on the sample through the electrode. Specifically, a metal plate which is formed in mesh or has one or plurality of holes is utilized as the electrode.

By disposing the electrode just above the sample and in parallel thereto, electric field approximately perpendicular to the sample is generated when negative voltage is applied. Therefore, photoelectrons are efficiently absorbed to the sample. Also, by using an electrode having approximately the same size as the sample, charges on a whole surface of the sample can be removed collectively and evenly, and a time required for the process can be reduced.

In the electron microscope application apparatus, it is possible to not only remove charges but also positively control the charges. When a sample is to be charged to a negative potential, an electrode potential is set to a negative potential relative to that of the sample and ultraviolet light is irradiated to the sample. Photoelectrons emitted from the electrode are pulled back to the sample due to electric field and then absorbed thereto. When the charges of the sample advance in a minus direction to reach the potential equivalent to that of the electrode, photoelectrons absorbed to the sample are balanced with photoelectrons emitted from the sample, and the charges are saturated.

On the contrary, when a sample is to be charged to a positive potential, the electrode potential is set to a positive potential relative to that of the sample, and ultraviolet light is irradiated to the sample. The ultraviolet light is irradiated to the sample via the electrode and photoelectrons are emitted from the sample. Since photoelectrons are emitted, when the charges of the sample advance in a plus direction and the sample is charged to the potential equivalent to that of the electrode, photoelectrons emitted from the sample are balanced with photoelectrons absorbed to the sample, and the charges are saturated.

Through the process described above, the charges of a sample can be controlled.

The effects obtained by typical aspects of the present invention will be briefly described below.

(1) By applying the present invention to a measuring apparatus based on charged particles, improvement in measurement precision and reproducibility can be achieved in the measuring apparatus.

(2) By applying the present invention to an inspection apparatus for semiconductor based on charged particles, detection of electrical characteristic failure at high sensitivity can be achieved.

BRIEF DESCRIPTIONS OF THE DRAWINGS

FIG. 14 is a diagram schematically showing a portion in the vicinity of a wafer in an enlarged manner;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
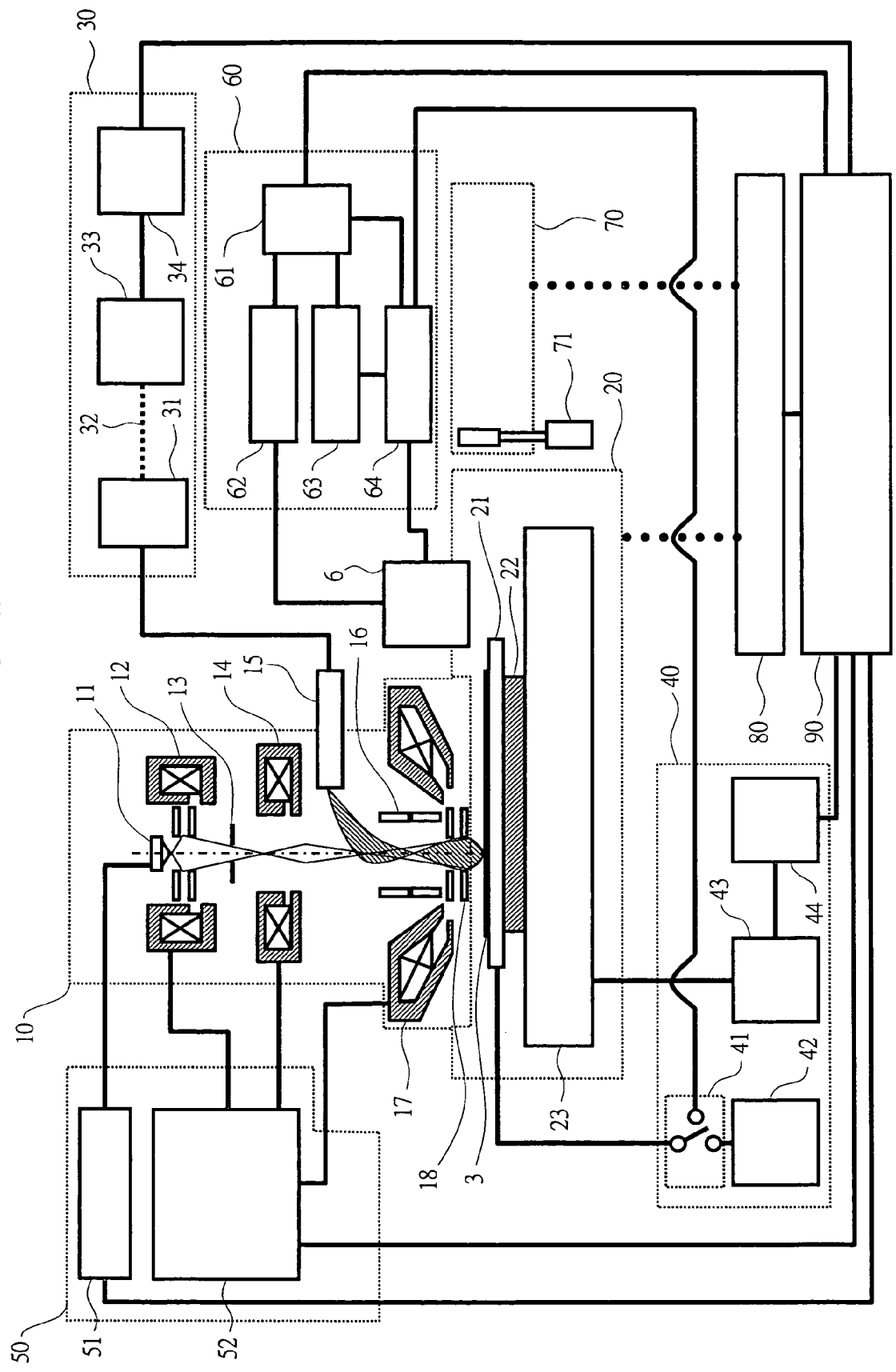
FIG. 1 is a diagram showing a structure of an electron microscope application apparatus according to a first embodiment of the present invention.

FIG. 1 is a diagram showing a structure of an electron microscope application apparatus according to a first embodiment of the present invention.

First, one example of a structure of the electron microscope application apparatus according to the first embodiment will be described with reference to FIG. 1. The electron microscope application apparatus according to the first embodiment is, for example, an SEM type semiconductor pattern inspection apparatus. The inspection apparatus roughly includes an SEM chassis 10, a charge control chassis 6, a sample chamber 20, a sample preparation chamber 70, an SEM control unit 50, a charge control system unit 60, an inspection system control unit 90, an evacuating system unit 80, a stage control unit 40, and others, and it is assumed that the SEM chassis 10, the charge control chassis 6, the sample chamber 20, and the sample preparation chamber 70 are evacuated by the evacuating system unit 80.

First, a basic structure of the SEM type semiconductor pattern inspection apparatus will be described. The SEM chassis 10 includes an electron source 11, a condenser lens A12, an aperture 13, a condenser lens B14, a detector 15, a deflector 16, an objective lens 17, a charge control electrode 18, and others.

The sample chamber 20 includes a stage 23, an insulating material 22, a wafer holder 21, and a wafer 3, in which the wafer holder 21 and the wafer 3 are electrically insulated from the grounded stage 23 by the insulating material 22, and voltage can be externally applied to the wafer holder 21 and the wafer 3 by a retarding power source 42.

Also, the stage 23 can move the wafer 3 and the wafer holder 21 in a vertical direction in a two-dimensional manner to the center axis of the SEM chassis 10, and the movement of the stage 23 is controlled by a stage controller 44 and a stage driving unit 43 in the stage control unit 40.

The SEM control unit 50 includes an electron gun power source for SEM 51 and a lens control unit 52. Primary electrons emitted from the electron source 11 are adjusted to be focused on the wafer 3 through the condenser lens A12, the condenser lens B14, and the objective lens 17.

At this time, energy of the primary electrons incident on the wafer 3 determined depending on a difference between a cathode voltage applied to the electron source 11 and a retarding voltage applied to the wafer 3, and the energy of primary electrons incident on the wafer 3 can be adjusted by changing the retarding voltage. Secondary electrons generated from the wafer 3 are accelerated and drawn into the detector 15. Note that, in order to form a scanned image, primary electrons are deflected by the deflector 16 so that they scan the wafer 3, secondary electrons taken in the detector 15 are converted to digital signal at an AD converter unit 31, and the digital signal is fed to an image processing unit 33 through an optical fiber 32. Then, a scanned image is formed in the image processing unit 33 as a map of secondary electron signals synchronized with scanning signals. In this case, it is assumed that the detector 15 and the AD converter unit 31 are floated to high voltage with positive polarity. In the image processing unit 33, equal pattern images at different places on the wafer 3 are compared with each other, and a defect portion on the wafer is extracted. Then, coordinate data of the extracted defect portion and an image thereof are stored as an inspection result. A user can check the inspection result as a defect distribution and the defect image in the wafer 3 through an image display unit 34 at any time.

In the semiconductor pattern inspection apparatus disclosed here, the inspection system control unit 90 stores information about a pattern of a wafer to be inspected and a process for the inspection, inspection conditions, an area to be inspected, threshold values for defect detection, and the like, and it collectively manages and controls the whole apparatus so as to always perform an optimal inspection. In this manner, in the semiconductor pattern inspection apparatus, the inspection of a wafer can be performed and a failure of a semiconductor pattern can be monitored regardless of the presence of an operator.

Figure 2:
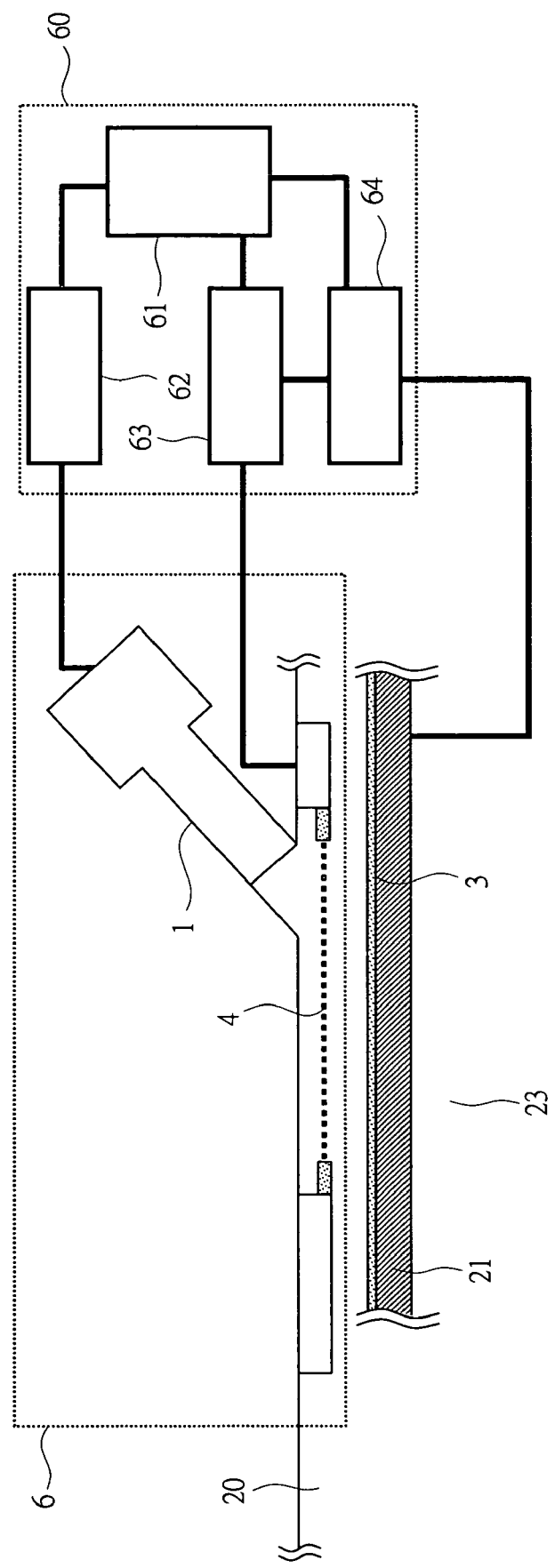
FIG. 2 is a diagram showing a structure of a charge control chassis shown in FIG. 1 in detail.
Figure 3:
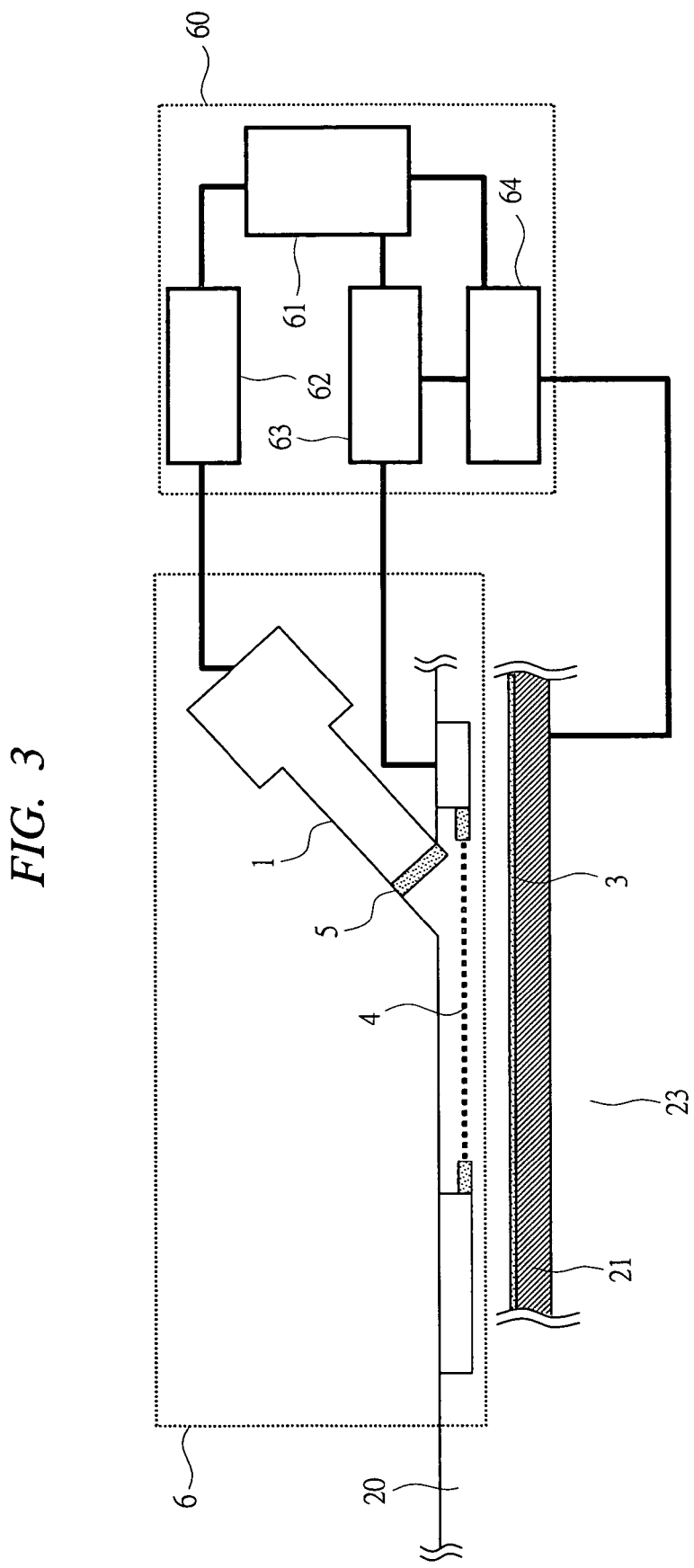
FIG. 3 is a diagram showing another structure of a charge control chassis shown in FIG. 1 in detail.

FIG. 2 is a diagram showing the structure of the charge control chassis 6 shown in FIG. 1 in detail, and FIG. 3 is a diagram showing another structure of the charge control chassis 6 shown in FIG. 1 in detail. As shown in FIG. 2, the charge control chassis 6 includes an ultraviolet light source 1, a charge control electrode 4, and others and is connected to the charge control system unit 60. The charge control electrode 4 is formed in a mesh (net-like) shape or a porous plate shape, in which a plurality of through-holes are formed. Operations of the charge control electrode 4 are collectively managed and controlled by the inspection system control unit 90 in which a voltage value of the charges, information about a flow of the charging process and the like are stored for each wafer to be inspected.

The charge control system unit 60 includes a charge control device 61, a power source for ultraviolet light source 62, a power source for control electrode 63, and a charge monitor unit 64, and the charge control device 61 controls the power source for ultraviolet light source 62, the power source for control electrode 63, and the charge monitor unit 64 based on the information sent from the inspection system control unit 90.

FIG. 2 shows the charge control chassis 6 and the charge control system unit 60 shown in FIG. 1 in an enlarged manner, and the charge control chassis 6 and the charge control system unit 60 include the ultraviolet light source 1, the sample chamber 20, the power source for ultraviolet light source 62, the power source for control electrode 63, the charge monitor unit 64, and others. The ultraviolet light source 1 is attached on the sample chamber 20, and it is arranged so as to irradiate the ultraviolet light to the wafer 3 through the charge control electrode 4. The power source for ultraviolet light source 62 is used to emit ultraviolet light from the ultraviolet light source 1. The power source for control electrode 63 is used for forming arbitrary electric field intensity including non electric field between the charge control electrode 4 and the wafer 3, and the charge monitor unit 64 has a function to monitor the absorption current flowing into the charge control electrode 4 and the wafer 3. The sample chamber 20 is composed of the wafer 3 and the wafer holder 21, and it is disposed on the sample stage 23. The sample stage 23 is to be controlled so that ultraviolet light irradiated from the ultraviolet light source 1 is irradiated on a whole surface of the sample. Also, the wafer 3 moves between a position just below the SEM chassis 10 and a position just below the charge control chassis 6 by means of the sample stage 23.

The charges of the wafer 3 can be controlled based on a potential difference between the charge control electrode 4 disposed just above the wafer 3 and the wafer 3.

Figure 4:
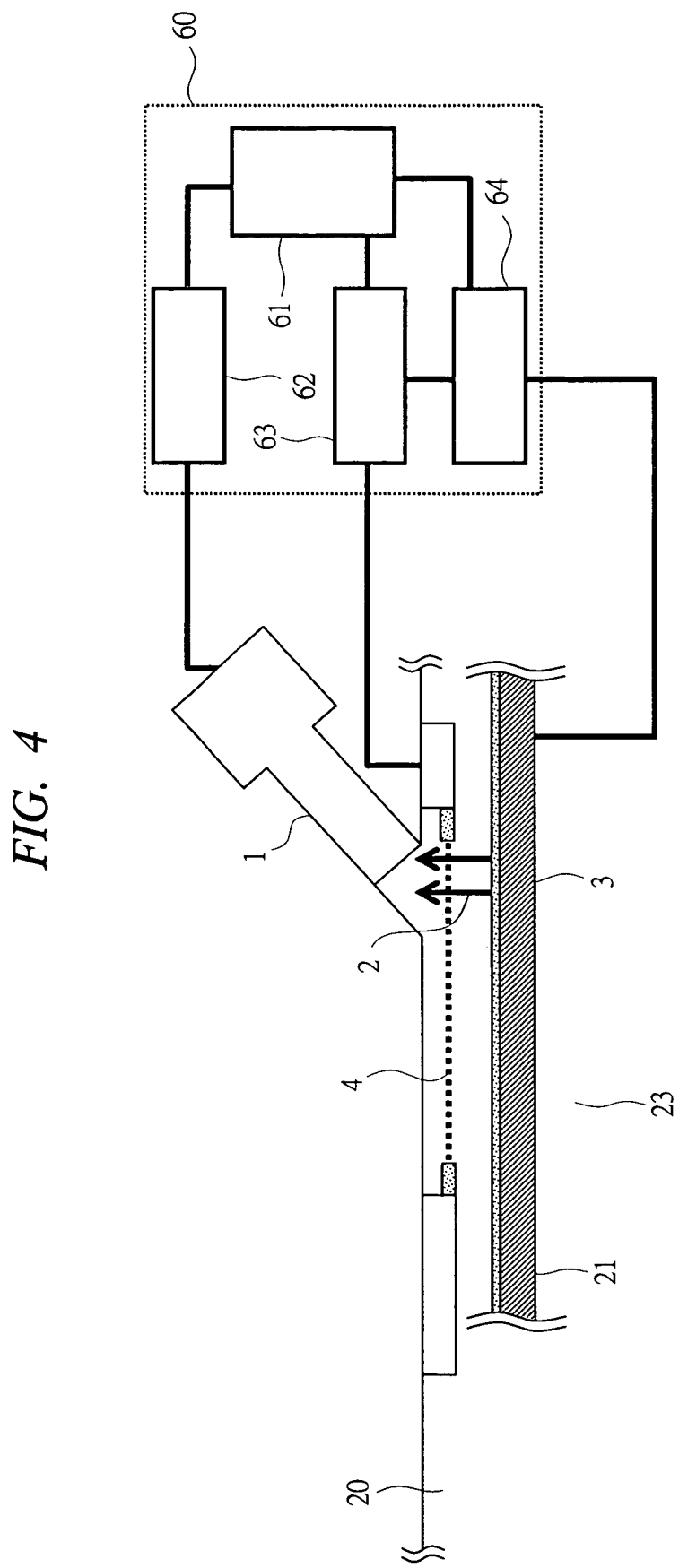
FIG. 4 is an explanatory diagram showing a method for controlling charges on a sample surface in the electron microscope application apparatus according to the first embodiment of the present invention.
Figure 5:
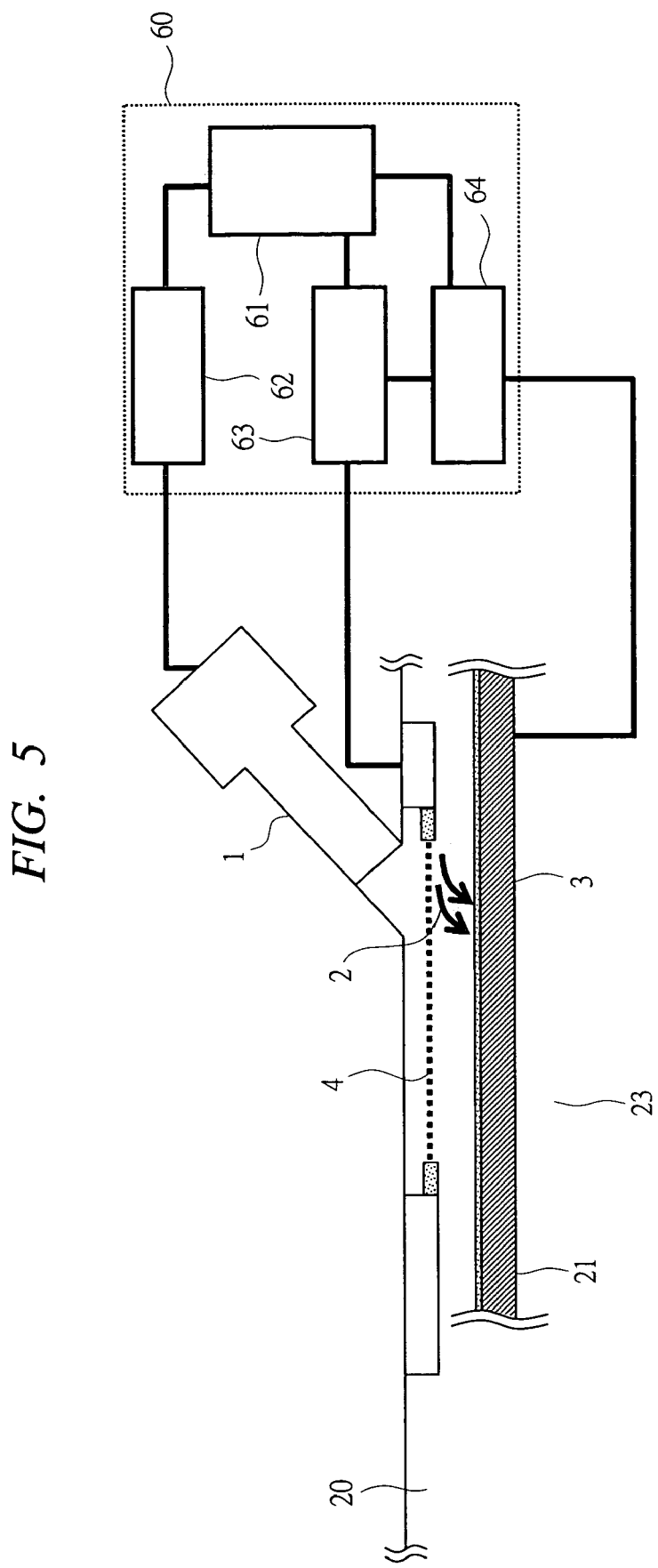
FIG. 5 is an explanatory diagram showing a method for controlling charges on a sample surface in the electron microscope application apparatus according to the first embodiment of the present invention.

FIG. 4 and FIG. 5 are explanatory diagrams showing a method for controlling the charges on a surface of a sample (wafer 3) in the electron microscope application apparatus according to the present embodiment.

When a surface of the wafer 3 is to be positively charged, ultraviolet light is irradiated on the wafer 3 while applying positive bias (potential of the charge control electrode 4>potential of the wafer 3). Ultraviolet light is irradiated to the wafer 3 through the charge control electrode 4 and holes of the charge control electrode 4, and photoelectrons 2 are emitted from the wafer 3 and the charge control electrode 4. Since the photoelectrons 2 are pulled up in a direction toward the charge control electrode 4 due to electric field, the surface of the wafer 3 is put into a state where electrons lack, and thus, the surface of the wafer 3 is positively charged (FIG. 4).

When the surface of the wafer 3 is to be negatively charged, ultraviolet light is irradiated to the wafer 3 while applying negative bias (potential of the charge control electrode 4<potential of the wafer 3). Ultraviolet light is irradiated to the wafer 3 through the charge control electrode 4 and holes of the charge control electrode 4, and photoelectrons 2 are emitted from the wafer 3 and the charge control electrode 4. In this case, since the photoelectrons 2 are pulled back in a direction toward the wafer 3 due to electric field unlike the case of the positive bias, the surface of the wafer 3 is put into a state of excessive electrons, and thus, the wafer 3 is negatively charged (FIG. 5).

Also, by setting potentials of the wafer 3 and the charge control electrode 4 to be equal to each other, charges of the surface of the wafer 3 can be made approximately 0 V.

The ultraviolet light source 1 used in the present embodiment has to be able to irradiate ultraviolet light having energy enough to emit photoelectrons from the charge control electrode 4 and the wafer 3. Material for the charge control electrode 4 is metal or compound having high quantum efficiency. Alternatively, it is also possible to deposit compound with high quantum efficiency on the charge control electrode 4. Since a work function of metal is about 4.5 eV though it depends on element, it is necessary to use ultraviolet light with a wavelength of 275 nm or shorter, and the wafer 3 can be negatively charged when using ultraviolet light in such a wavelength range.

In general, the surface of the wafer 3 is generally covered with insulating material such as a silicon dioxide film or a silicon nitride film, and the work function of the material is 7 eV or more. Therefore, when the wafer 3 is to be positively charged, it is necessary to use ultraviolet light with a wavelength of 177 nm or shorter.

Ultraviolet light with a wavelength shorter than the wavelength range degrades the characteristics of a semiconductor device in some cases. Such ultraviolet light is ultraviolet light with a wavelength range of 10 nm or shorter, that is, ultraviolet light in a range called "EUV (Extreme Ultraviolet). As shown in FIG. 3, therefore, a filter 5 shielding ultraviolet light with a wavelength range of 10 nm or shorter is interposed between the ultraviolet light source 1 and the wafer 3 so that degradation of the semiconductor device is prevented. In the structure of FIG. 3, the filter 5 is disposed between the ultraviolet light source 1 and the wafer 3.

In the structure shown in FIG. 2, ultraviolet light is simultaneously irradiated to the charge control electrode 4 and the wafer 3. When the wafer 3 is to be positively charged, photoelectrons 2 emitted from the wafer 3 are pulled up by applying plus voltage relative to that of the wafer 3 to the charge control electrode 4 (FIG. 4). When charges of the charge control electrode 4 and the wafer 3 reach the same potential, electric field for pulling the photoelectrons 2 upward disappears. Therefore, the wafer 3 is not charged to a potential above the same potential.

When the wafer 3 is to be negatively charged, photoelectrons 2 emitted from the charge control electrode 4 are pulled back to the wafer 3 by applying minus voltage relative to that of the wafer 3 to the charge control electrode 4 (FIG. 5). When charges of the charge control electrode 4 and the wafer 3 reach the same potential, electric field for pulling the photoelectrons 2 back disappears. Therefore, the wafer 3 is not charged to a potential below the same potential.

Determination whether or not charge of the wafer 3 is saturated can be made by monitoring an absorption current of the wafer 3. As described above, when the charge potentials of the wafer 3 and the charge control electrode 4 become the same potential, the photoelectrons 2 are not pulled upward or are not pulled back. Therefore, the absorption current in the wafer 3 is reduced and current hardly flows.

Figure 6:
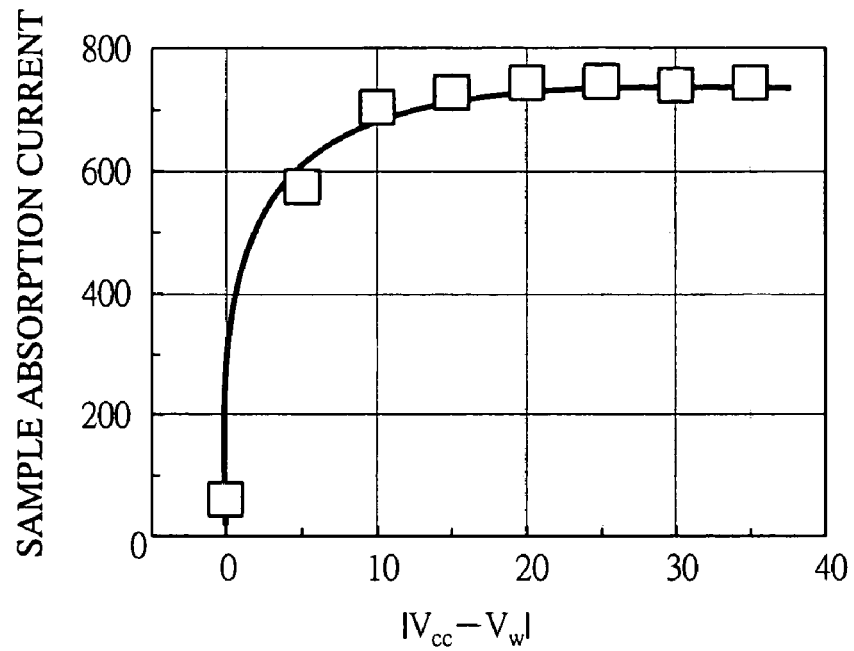
FIG. 6 is a graph showing a relationship between a potential difference between a charge control electrode and a sample and a sample absorption current in the electron microscope application apparatus according to the first embodiment of the present invention.

FIG. 6 is a graph showing a relationship between a potential difference between the charge control electrode 4 and a sample (wafer 3) and a sample absorption current in the electron microscope application apparatus according to the present embodiment. In the graph of FIG. 6, a horizontal axis indicates an absolute value of a difference between a charge control electrode voltage $V_{cc}$ and a wafer charge potential $V_w$ and a vertical axis indicates a wafer absorption current. As the difference between $V_{cc}$ and $V_w$ approaches zero, an absorption current decreases to become approximately zero. Therefore, determination whether or not the charge has been saturated is possible based on the absorption current in the wafer 3.

Next, a sample inspection method in an electron beam appearance inspection apparatus will be described.

Figure 7:
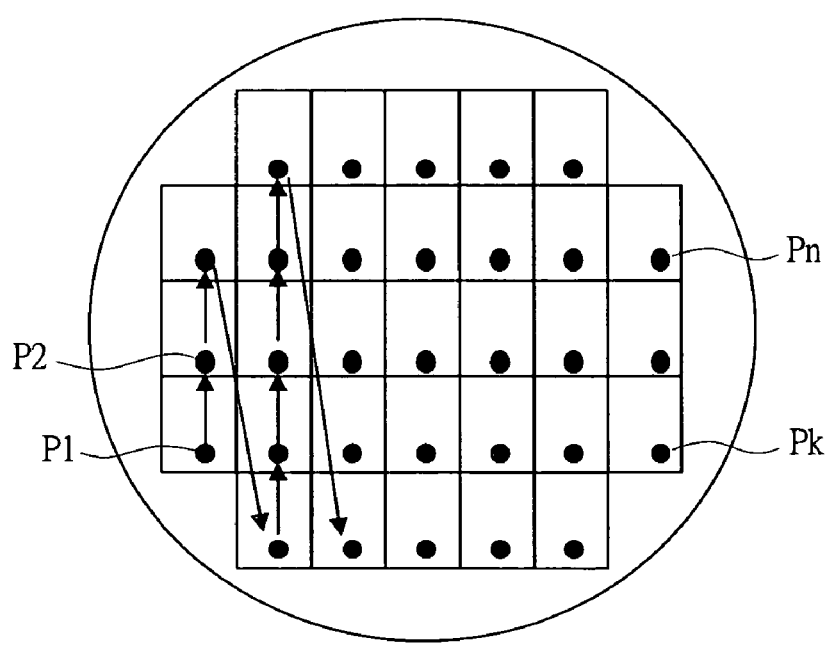
FIG. 7 is a diagram showing a movement of a wafer in the electron microscope application apparatus according to the first embodiment of the present invention.
Figure 8:
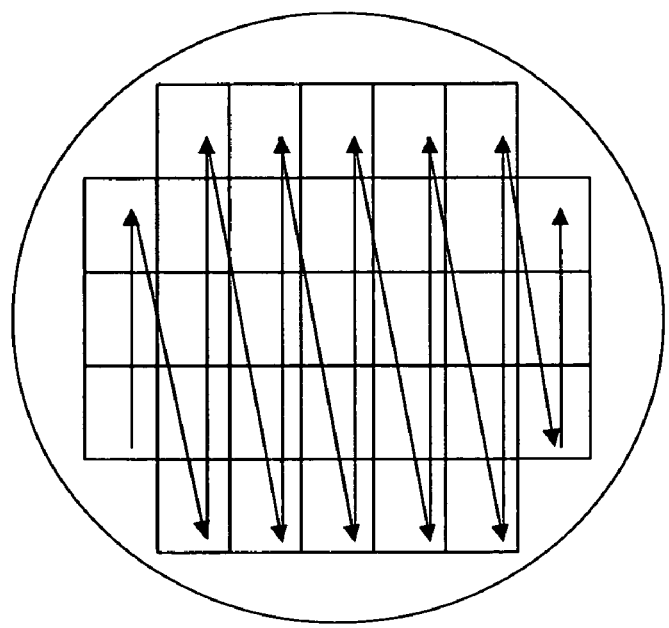
FIG. 8 is a diagram showing a movement of a wafer in the electron microscope application apparatus according to the first embodiment of the present invention.

First, a desired voltage is applied to the charge control electrode 4, ultraviolet light source 1 is turned ON, and a wafer 3 is moved below the charge control electrode 4. When a whole surface of the wafer 3 is to be charged, the stage 23 is controlled so that the whole surface of the wafer passes below the charge control electrode 4. FIG. 7 and FIG. 8 are diagrams showing the movement of the wafer in the sample inspection method according to the present embodiment. The movement of the wafer includes a method in which a wafer moves continuously at a fixed velocity and the charge of the whole surface of the wafer is controlled at once as shown in FIG. 8 and a method in which the wafer moves predetermined regions Pk (k=1 to n) on the wafer to stop as shown in FIG. 7.

Figure 9:
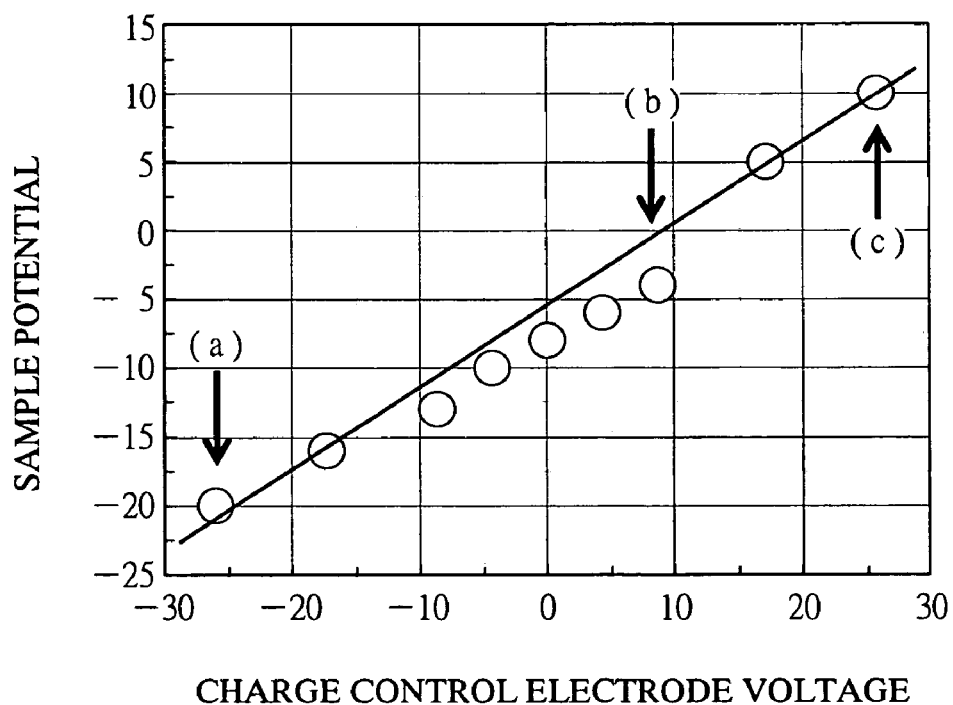
FIG. 9 is a graph showing a relationship between the charge control electrode voltage and a sample potential in the electron microscope application apparatus according to the first embodiment of the present invention.
Figure 10A:
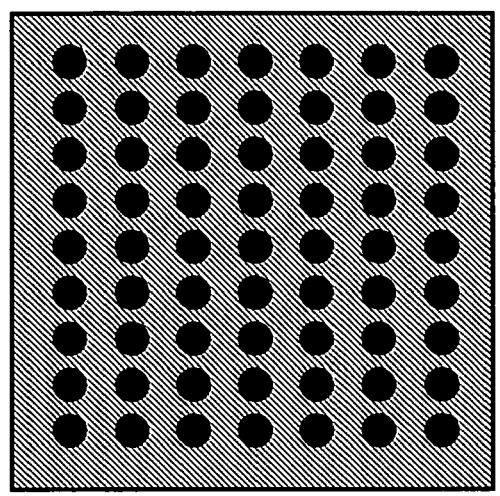
FIG. 10A is a diagram showing an SEM image at point (a) in FIG. 9.
Figure 10B:
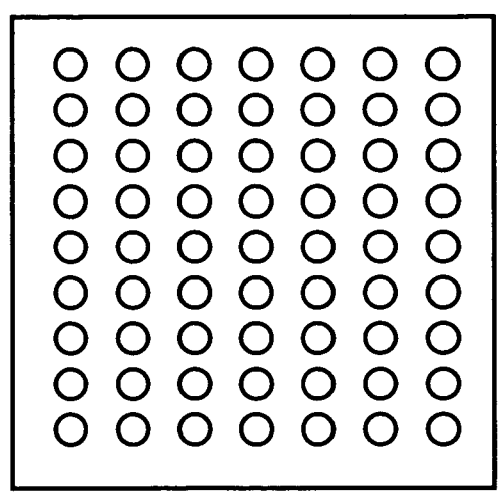
FIG. 10B is a diagram showing an SEM image at point (b) in FIG. 9.
Figure 10C:
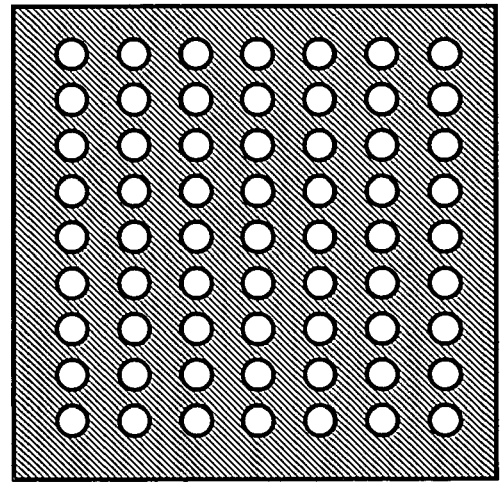
FIG. 10C is a diagram showing an SEM image at point (c) in FIG. 9.

An example where charges of the wafer 3 are controlled according to the method described above is shown in FIG. 9. As is evident from FIG. 9, a voltage of the charge control electrode 4 and a potential of the wafer 3 (sample) are in a linear proportional relationship, and charge of the wafer 3 can be controlled. Also, SEM images of contact holes formed in a silicon dioxide film in respective charged states indicated by (a), (b), and (c) in FIG. 9 are shown in FIG. 10A, FIG. 10B, and FIG. 10C. FIG. 10A shows an SEM image when the wafer 3 is negatively charged, in which the contact holes are observed to be darker than the oxide film around them. Incidentally, round portions correspond to the contact holes and a portion around the contact holes corresponds to the oxide film. FIG. 10B shows an SEM image when the potential of the wafer 3 is approximately 0 V, namely, it is not charged, in which a contrast between the contact holes and the oxide film around them is observed to be low. FIG. 10C shows an SEM image when the wafer 3 is positively charged, in which the contact holes are observed to be brighter than the oxide film around the contact holes. Thus, SEM images having a contrast corresponding to the charged state of the wafer 3 can be observed, and it has been confirmed that the charge control method according to the present invention is effective.

In this case, the silicon dioxide film has been described as an example, but similar effects can be obtained also when using other insulating material, for example, a silicon nitride film or resist.

The charge control apparatus and method have been described with using the semiconductor pattern inspection apparatus as an example in the present embodiment. However, the electron microscope application apparatus and the sample inspection method according to the present invention can be applied to pattern size measurement of a semiconductor and a charge removing process in a semiconductor manufacturing process, and also, a sample to be processed in the electron microscope application apparatus and the sample inspection method according to the present invention is not limited to a semiconductor device and it may be any sample whose surface is formed from an insulating film.

Second Embodiment

In the electron microscope application apparatus according to the first embodiment, charges of the sample surface can be controlled to both positive polarity and negative polarity by using the ultraviolet light source 1 and the charge control electrode 4. In the second embodiment, a method for collectively controlling the charge of the whole surface of the wafer by irradiating ultraviolet light to an area approximately equal to the area of the wafer 3 will be described.

Figure 11:
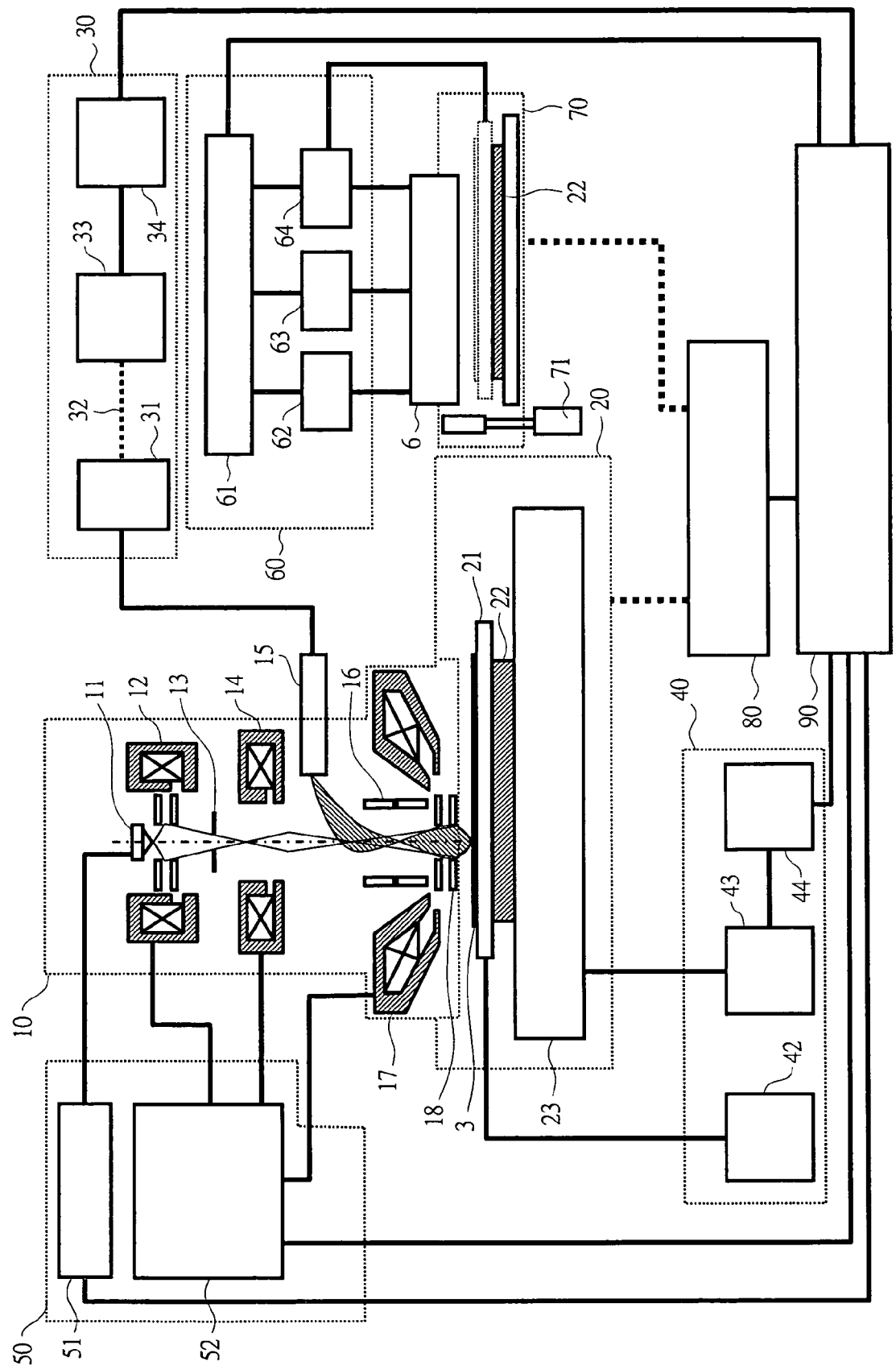
FIG. 11 is a diagram showing a structure of an electron microscope application apparatus according to a second embodiment of the present invention.
Figure 12:
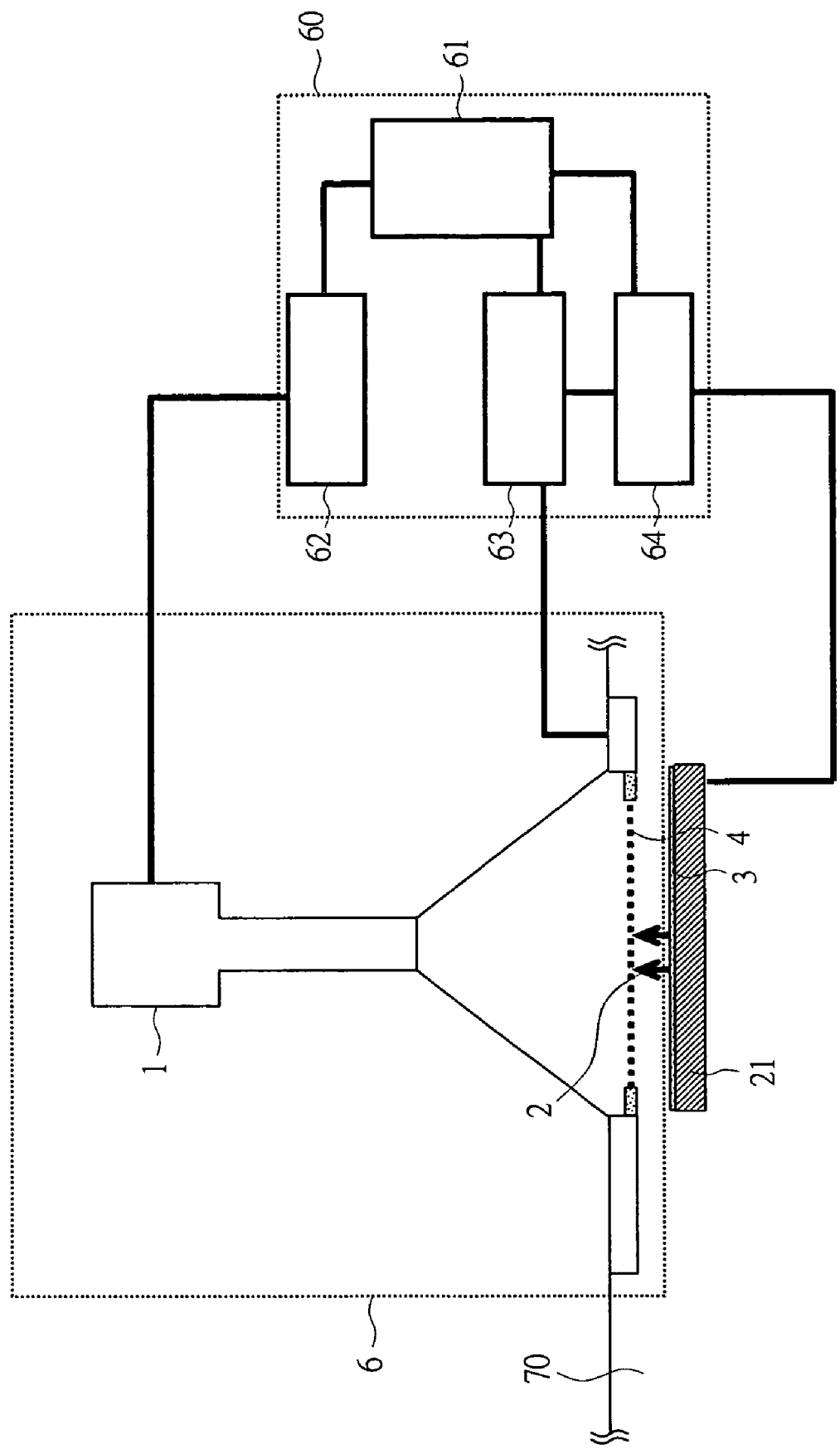
FIG. 12 is a diagram showing a structure of a charge control chassis shown in FIG. 11 in detail.

FIG. 11 is a diagram showing a structure of an electron microscope application apparatus according to the second embodiment, and FIG. 12 is a diagram showing a structure of a charge control chassis 6 shown in FIG. 11 in detail.

FIG. 12 shows an example where the electron microscope application apparatus according to the present embodiment is mounted on a semiconductor pattern inspection apparatus. In this example, the ultraviolet light source 1 is mounted on a sample preparation chamber 70. Accordingly, in the semiconductor pattern inspection apparatus according to the second embodiment, after the process for controlling the charge is performed in the sample preparation chamber 70, a sample is transferred to the sample chamber 20 and then inspected therein. Also, the charge control system unit 60 includes the power source for ultraviolet light source 62 and the charge monitor unit 64, and operations thereof are collectively managed and controlled by the inspection system control unit 90 like the first embodiment.

Since ultraviolet light is irradiated on a whole surface of a wafer in the second embodiment as shown in FIG. 12, it is possible to control the charges of the wafer whole surface collectively and evenly. Further, since charges can be controlled collectively, an irradiation time can be reduced, which is useful for throughput improvement.

In the second embodiment, even if a wafer to be inspected has been already charged due to the process prior to the inspection performed in this inspection apparatus, the charges of the wafer can be removed in the sample preparation chamber 70. By removing the charges just prior to this inspection, a charged state of the wafer can be kept uniform. Therefore, the reproducibility in inspection can be improved.

Third Embodiment

Figure 13:
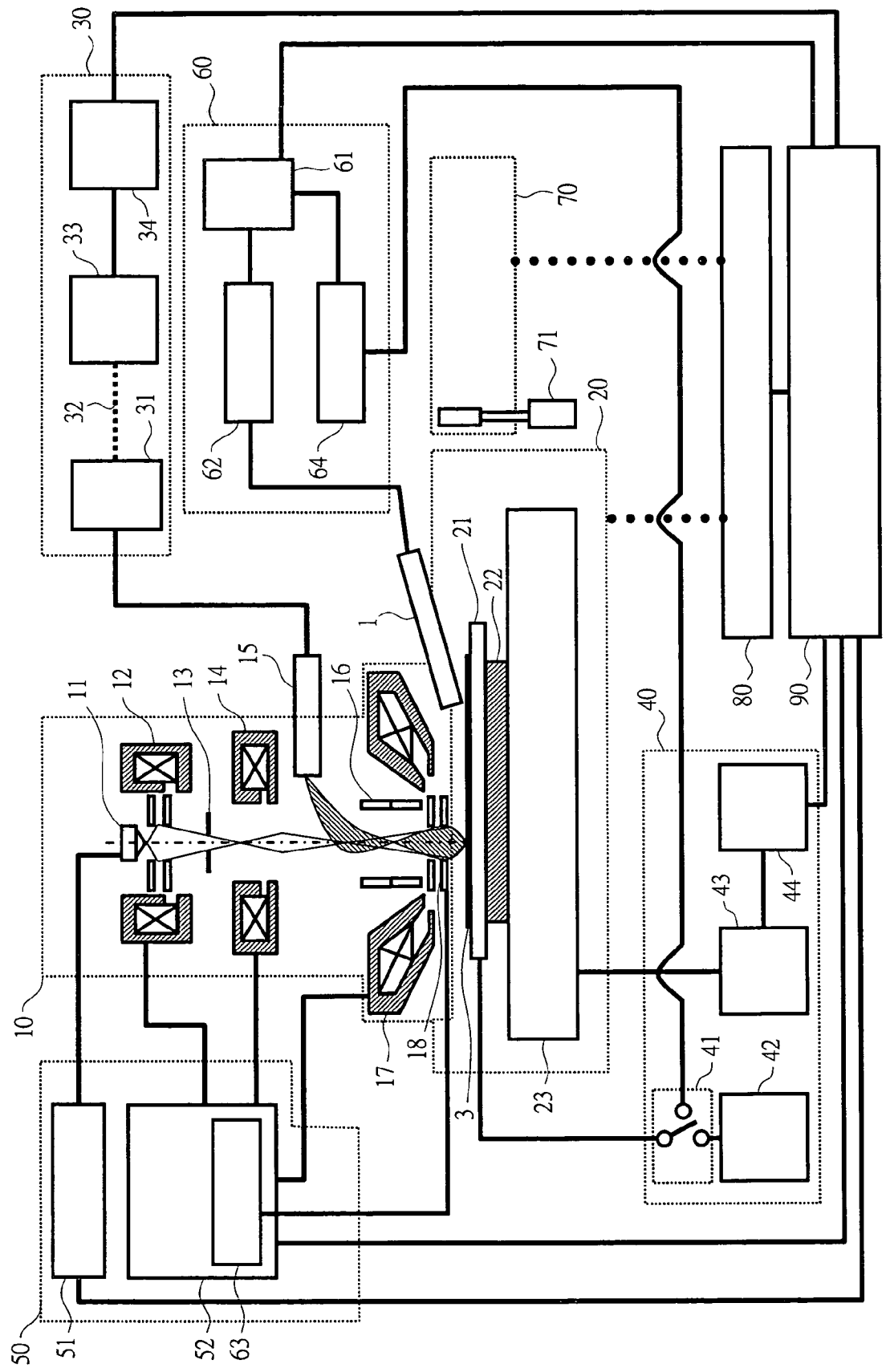
FIG. 13 is a diagram showing a structure of an electron microscope application apparatus according to a third embodiment of the present invention.

FIG. 13 is a diagram showing a structure of an electron microscope application apparatus according a third embodiment.

FIG. 13 shows an example where the electron microscope application apparatus according to the present embodiment is mounted on a semiconductor pattern inspection apparatus. A charge control device shown in the third embodiment is an ultraviolet light source which is mountable to an existing apparatus, and similar effects can be realized by mounting this ultraviolet light source to another apparatus using charged particles. In FIG. 13, the ultraviolet light source 1 is attached below an objective lens 17, and it can irradiate ultraviolet light on an area approximately equal to an area to be inspected or an area including the area to be inspected and its vicinity. That is, the area to be inspected in the third embodiment is an area in which electrons emitted from the electron source 11 mounted on the SEM chassis 10 are focused to be irradiated on the wafer 3, and the ultraviolet light source 1 is attached so as to irradiate ultraviolet light to the area.

Process for the inspection and charge control is collectively managed and controlled by the inspection system control unit 90 based upon inspection conditions and process conditions for charge control which are inputted by a user. In the inspection process, after a relay circuit 41 in the stage control unit 40 is switched to the retarding power source 42 and retarding voltage is applied to the wafer 3, an image on an area to be inspected is formed by using electrons emitted from the electron source 11. Note that, at this time, the ultraviolet light source 1 is controlled by the power source for ultraviolet light source 62 so that ultraviolet light emitted from the ultraviolet light source 1 does not block the image formation. On the other hand, in the process of charge control, the relay circuit 41 is switched to the charge monitor unit 64, and an absorption current flowing in the wafer 3 can be monitored in the process of charge control. Uniformity of the charges can be achieved by moving the stage 23 so that ultraviolet light emitted from the ultraviolet light source 1 is thoroughly irradiated on at least an area larger than the area to be inspected of the wafer 3 and performing this process at least once.

Next, an example where charge control to a wafer is performed by using the ultraviolet light source 1 will be described with reference to FIG. 14. FIG. 14 schematically shows a portion near the wafer 3 in the electron microscope application apparatus shown in FIG. 13 in an enlarged manner, in which illustration of a portion of the SEM chassis 10 above the objective lens 17 is omitted. Ultraviolet light emitted from the ultraviolet light source 1 is obliquely irradiated onto an intersection point between the approximate central axis of the SEM chassis 10 and the wafer 3. The charge control electrode 18 can apply a voltage of a positive or negative polarity relative to the potential of the wafer 3 and can switch the polarity by a switch in the power source for control electrode 63. A surface of the wafer 3 can be adjusted to any voltage by the switching of the polarity.

Figure 15A:
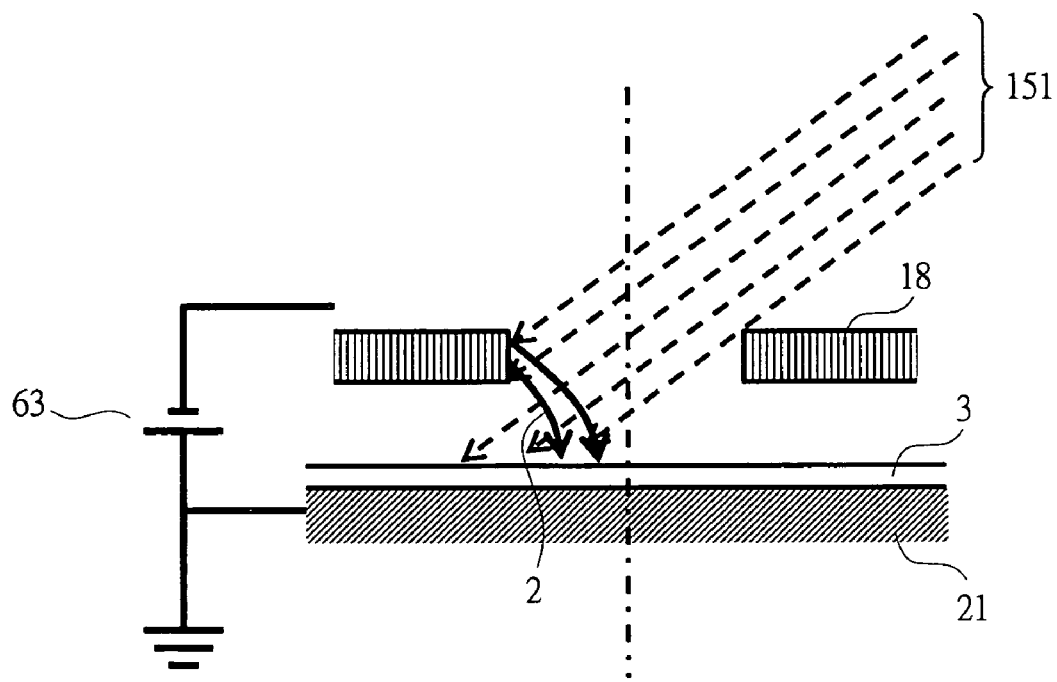
FIG. 15A is an explanatory diagram showing a charge control method in the electron microscope application apparatus according to the third embodiment of the present invention.
Figure 15B:
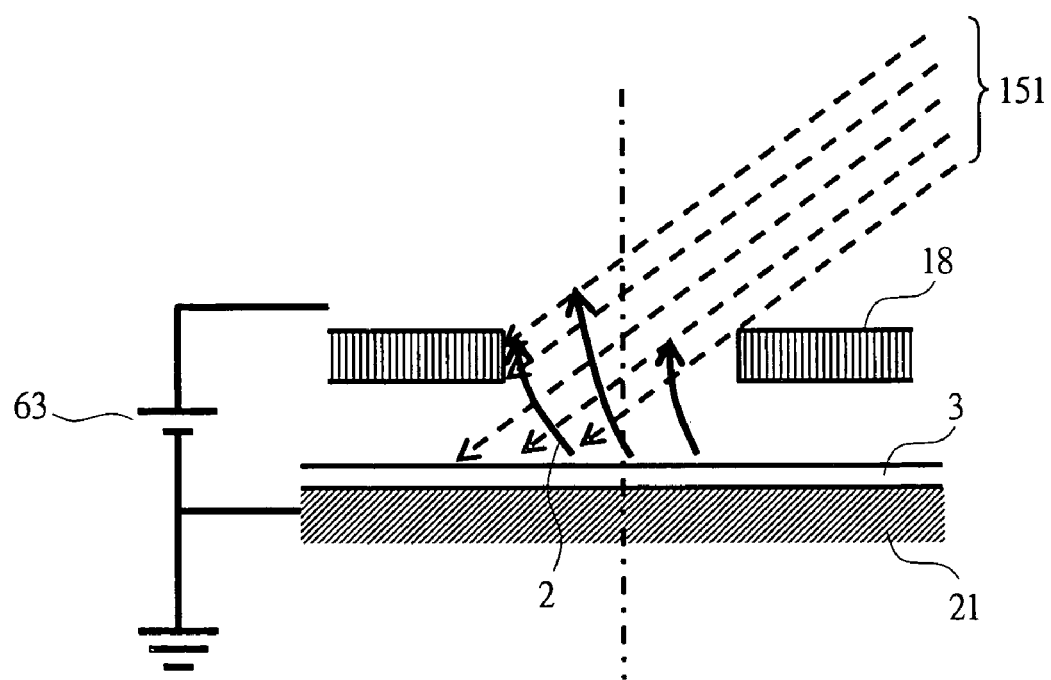
FIG. 15B is an explanatory diagram showing a charge control method in the electron microscope application apparatus according to the third embodiment of the present invention.

FIG. 15A and FIG. 15B are explanatory diagrams showing a charge control method in the electron microscope application apparatus according to the third embodiment. FIG. 15A shows a case where the wafer 3 is negatively charged and a negative voltage relative to the wafer 3 is applied to the charge control electrode 18. Broken lines indicate ultraviolet light 151 emitted from the ultraviolet light source 1, and the ultraviolet light 151 is assumed to be irradiated on the charge control electrode 18 and a portion approximately just below the same. Photoelectrons 2 emitted from the charge control electrode 18 are returned back to the wafer 3 by the negative voltage applied to the charge control electrode 18. In this manner, the wafer 3 is negatively charged.

Also, FIG. 15B shows a case where the wafer 3 is positively charged, and a positive voltage relative to the wafer 3 is applied to the charge control electrode 18. In this case, since photoelectrons 2 emitted from the wafer 3 are pulled up to the charge control electrode 18, the wafer 3 is positively charged. Since the charge potential can be controlled by the charge control electrode as shown in the first embodiment, the potential does not exceed a desired charge potential.

Process of charge control can be performed by simply mounting the structure shown in the third embodiment on an existing equipment. In the third embodiment, the pattern inspection apparatus has been described, but the principle of the present invention can be applied to not only the pattern inspection apparatus but also all apparatuses using charged particles.

Fourth Embodiment

There is such a problem that a secondary electron trajectory is curved by the charges caused by electron beam scanning in the SEM and a correct sample shape cannot be observed. In the fourth embodiment, a technology for observing a correct sample shape by suppressing the charges will be described, in which ultraviolet light is intermittently irradiated during electron beam scanning with using the pattern inspection apparatus shown in the third embodiment.

Figure 16A:
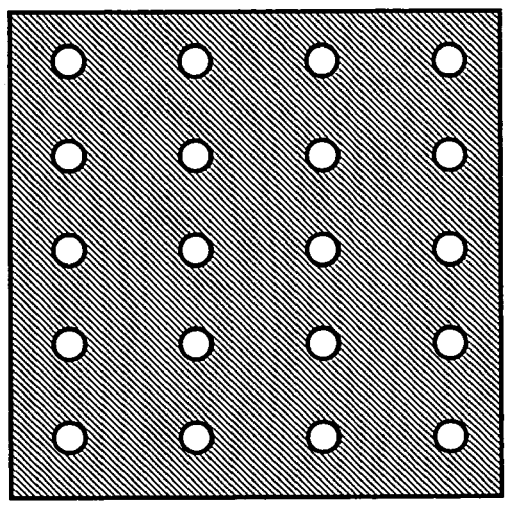
FIG. 16A is a diagram showing a semiconductor pattern in a fourth embodiment of the present invention.
Figure 16B:
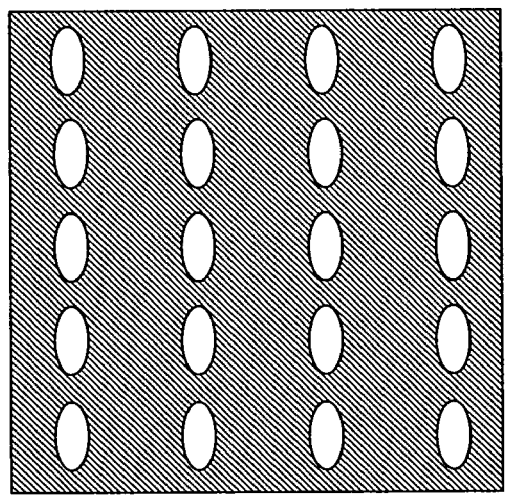
FIG. 16B is a diagram showing a semiconductor pattern in a fourth embodiment of the present invention.
Figure 16C:
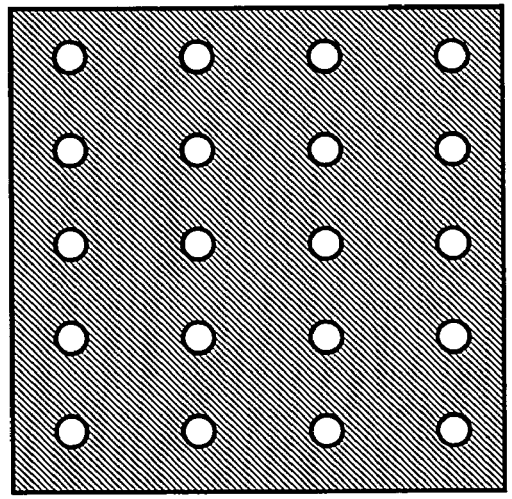
FIG. 16C is a diagram showing a semiconductor pattern in a fourth embodiment of the present invention.

In the SEM, a real image of a sample is formed by scanning electron beam on the sample to detect secondary electrons. For example, when a sample shown in FIG. 16A is observed, an SEM image shown in FIG. 16C can be acquired. Note that FIG. 16A to FIG. 16C are diagrams showing semiconductor patterns in the fourth embodiment, and round portions correspond to contact holes.

In the SEM, electron beam scans an observation area in a left-to-right direction and in an up-to-down direction. At this time, an area to which electron beam has been irradiated (irradiated area) and an area to which electron beam has not been irradiated (non-irradiated area) are present even within the observation area. When the irradiated area is charged, electric field is generated between the irradiated area and the non-irradiated area, and an SEM image with distorted pattern shape such as shown in FIG. 16B is observed.

Figure 17A:
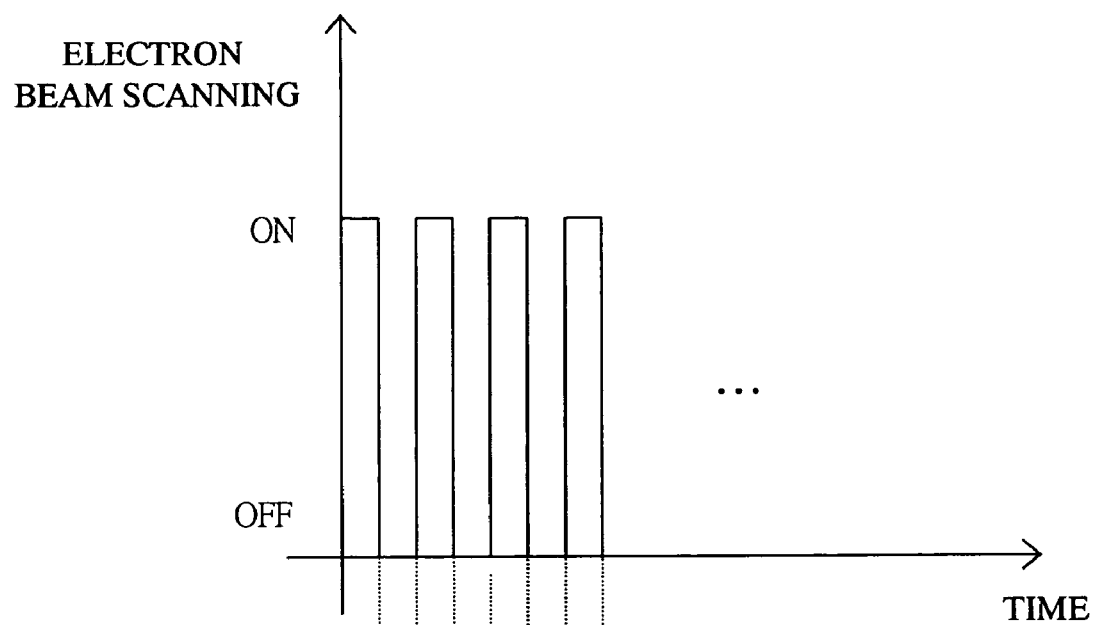
FIG. 17A is a graph showing a relationship in time between electron beam scanning and ultraviolet light irradiation in the fourth embodiment of the present invention.
Figure 17B:
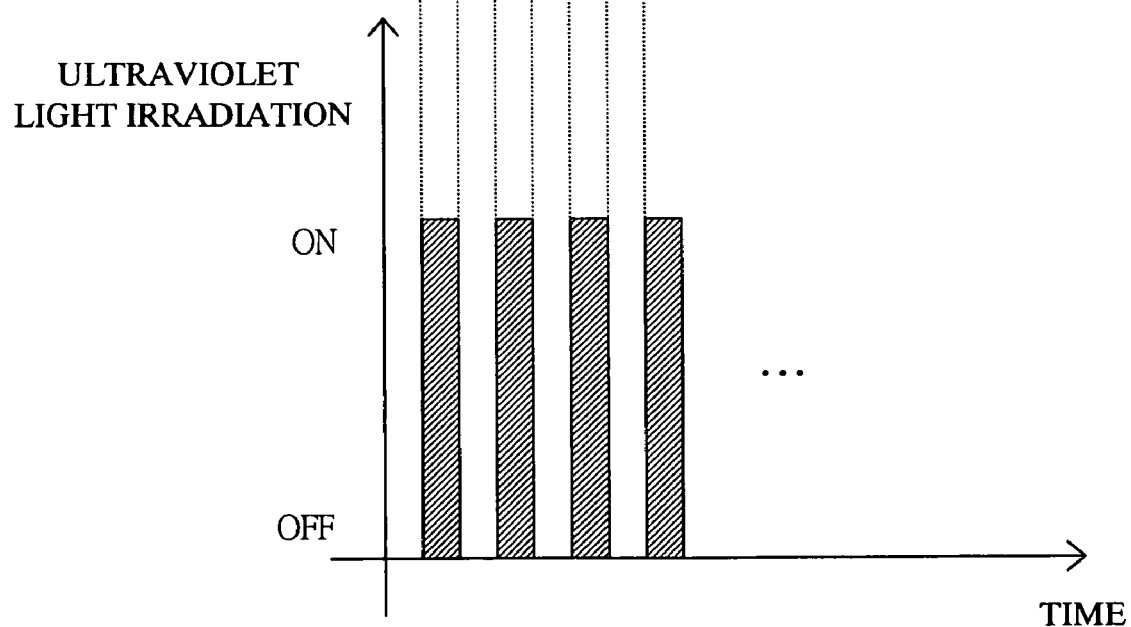
FIG. 17B is a graph showing a relationship in time between electron beam scanning and ultraviolet light irradiation in the fourth embodiment of the present invention.

FIG. 17A and FIG. 17B are graphs showing a relationship in time between electron beam scanning and ultraviolet light irradiation in the fourth embodiment. An electron beam scanning method and an ultraviolet light irradiation method for suppressing the charges due to electron beam scanning will be described with reference to FIG. 17A and FIG. 17B. After electron beam scans from a left end of an observation area to a right end thereof, the electron beam is returned from the right end back to the left end. At this time, electron beam is not irradiated on a sample (FIG. 17A). Thus, ultraviolet light is irradiated during the time when electron beam is not irradiated, thereby removing the charges on the irradiated area (FIG. 17B).

By repeating electron beam irradiation and ultraviolet light irradiation in this manner, a difference in charge between the irradiated area and the non-irradiated area is cancelled. Therefore, a normal SEM image shown in FIG. 16C can be acquired.

In the fourth embodiment, the pattern inspection apparatus has been described, but the principle of the present invention can be applied to not only the pattern inspection apparatus but also all apparatuses using charged particles.

Fifth Embodiment

In a fifth embodiment, a structure and a method of using the structure in the case where the electron microscope application apparatus according to the present invention is mounted on a critical dimension SEM will be described.

Figure 18:
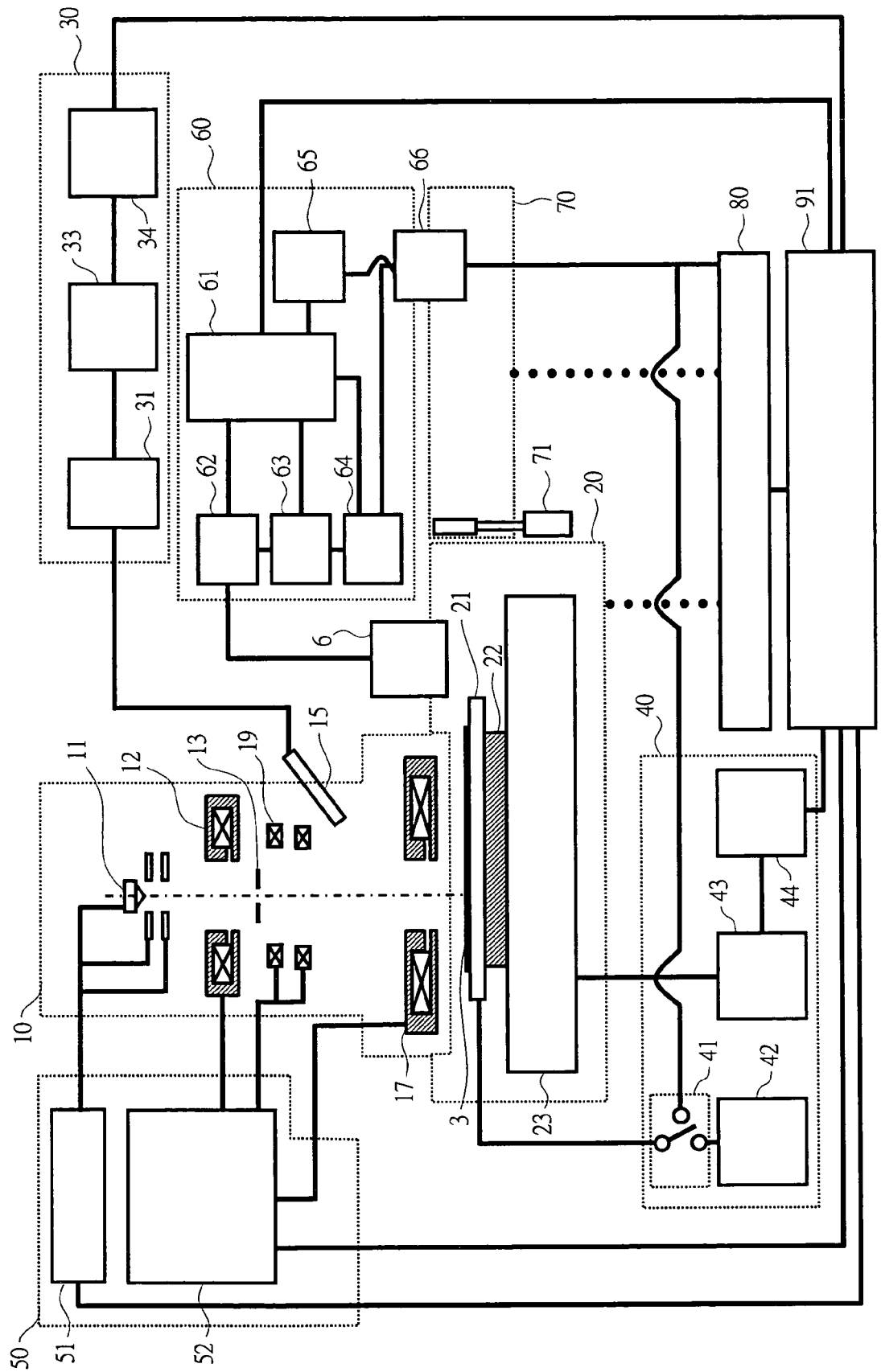
FIG. 18 is a diagram showing a structure of an electron microscope application apparatus according to a fifth embodiment of the present invention.

FIG. 18 shows a critical dimension SEM equipped with the electron microscope application apparatus according to the present invention. The critical dimension SEM roughly includes an SEM chassis 10, a charge control chassis 6, a sample chamber 20, a sample preparation chamber 70, an SEM control unit 50, a charge control system unit 60, a critical dimension measuring system control unit 91, an evacuating system unit 80, a stage control unit 40, and others, in which the SEM chassis 10, the sample chamber 20, and the sample preparation chamber 70 are evacuated by the evacuating system unit 80.

Primary electron beam emitted from a cathode by the voltage applied to the cathode and a first anode is accelerated by the voltage applied to a second anode and advances to a lens system of a latter stage. The primary electron beam is focused as a minute spot on a sample by a condenser lens A12 and the objective lens 17 controlled by the lens control unit 52, and it scans the sample in a two-dimensional manner by a two-staged deflection coil 19. Scanning signal of the deflection coil 19 is controlled by the critical dimension measuring system control unit 91 via the SEM control unit 50 in accordance with an observation magnification designated through an input device.

In the structure of the apparatus, charge in a wafer surface is measured by using a voltage measuring probe 66 in the sample preparation chamber 70, and charges are removed in the sample chamber 20 based on the measurement result. By measuring a pattern size after removing the charges, measurement can be performed with high precision.

Figure 19:
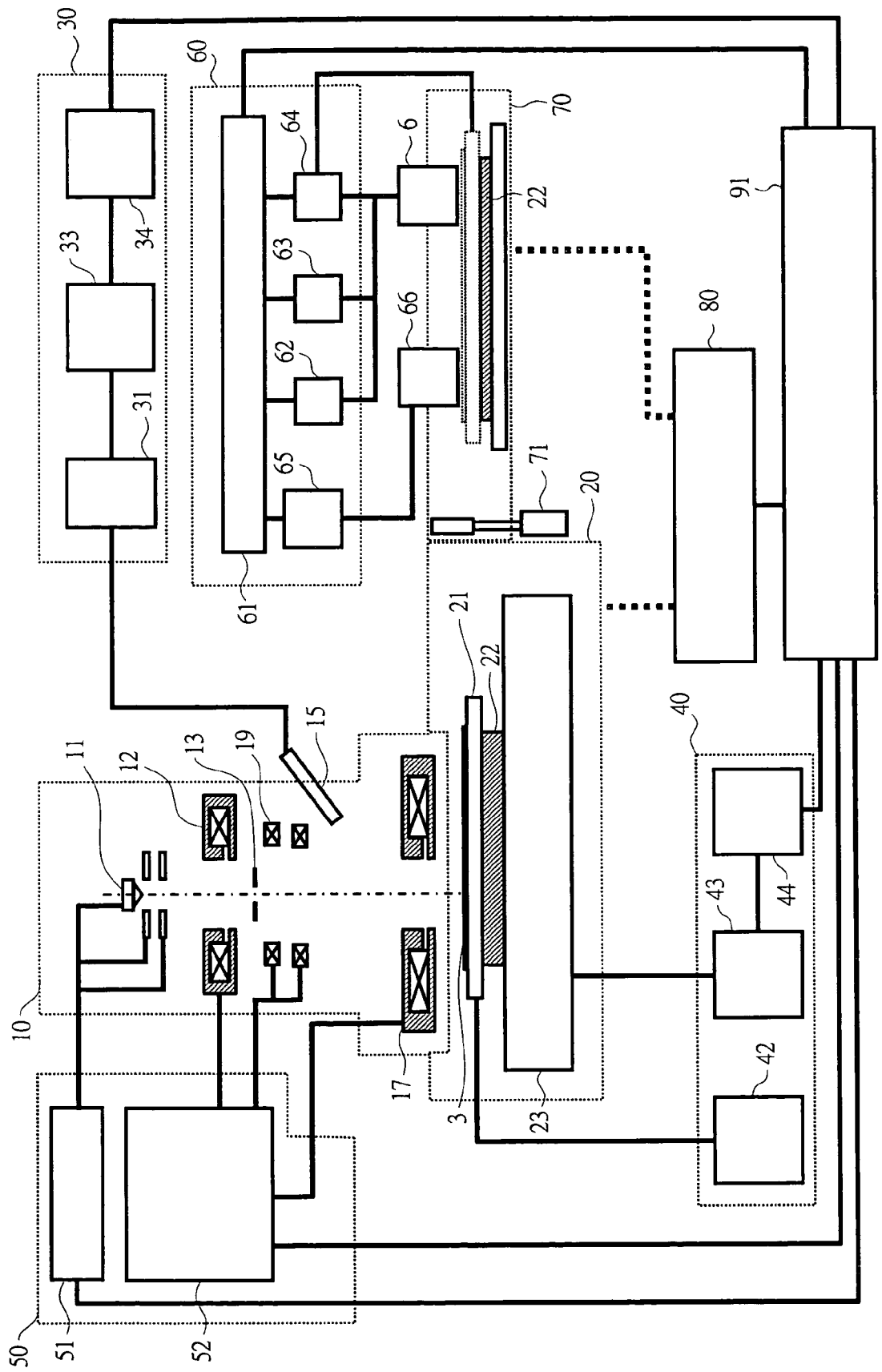
FIG. 19 is a diagram showing another structure of an electron microscope application apparatus according to the fifth embodiment of the present invention.

FIG. 19 shows a case where the electron microscope application apparatus according to the present invention is mounted on the sample preparation chamber 70 of the critical dimension SEM. The degradation of a critical dimension measuring precision due to the charges can be prevented by measuring a charge distribution in a wafer surface in the sample preparation chamber 70 and performing the observation after setting optical conditions in accordance with the charge.

However, the optical conditions cannot be sufficiently corrected depending on the magnitude of charge in some cases.

Therefore, in such a case, observation is performed after the process of removing the charge of a wafer by using the electron microscope application apparatus according to the present invention. Since the process of removing the charge is performed, length measurement with excellent reproducibility which is not influenced by the charge can be provided.

Figure 20A:
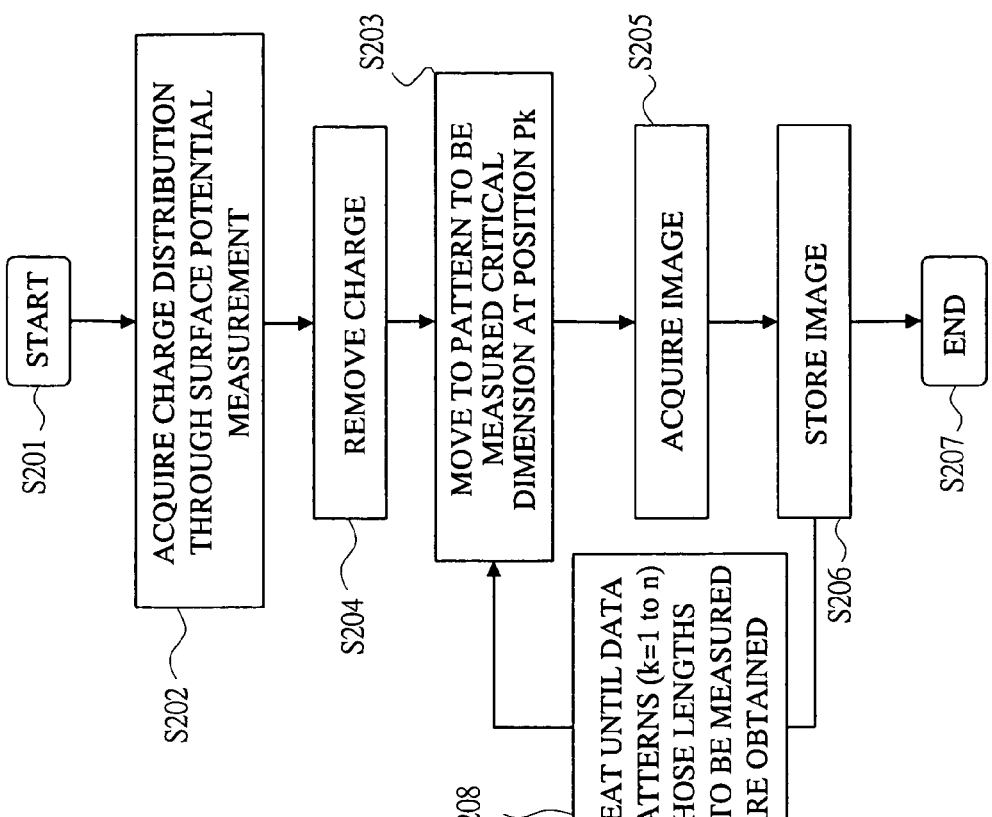
FIG. 20A is a flowchart showing a procedure for using a critical dimension SEM in the fifth embodiment of the present invention.
Figure 20B:
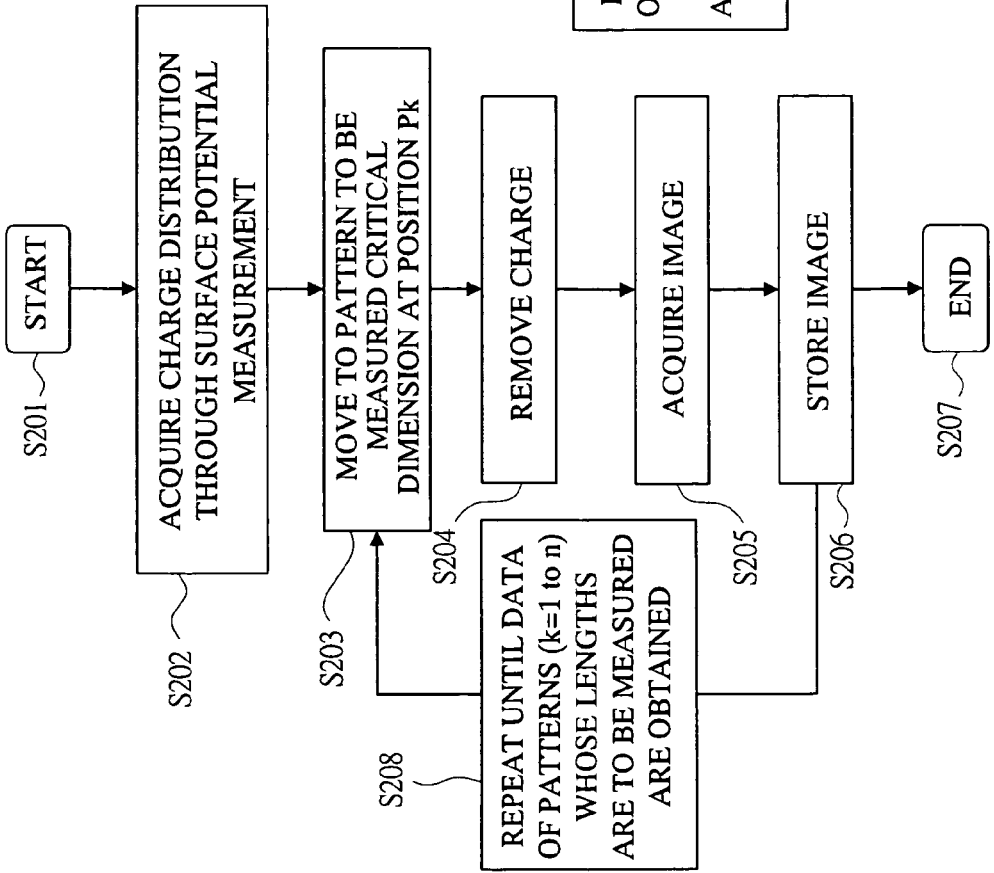
FIG. 20B is a flowchart showing a procedure for using a critical dimension SEM in the fifth embodiment of the present invention.

FIG. 20A and FIG. 20B are flowcharts showing a procedure for using a critical dimension SEM according to the fifth embodiment. FIG. 20A shows a sequence in the case where the charge is removed at each movement to a pattern to be measured critical dimension.

As shown in FIG. 20A, first, a critical dimension measuring sequence starts (Step S201), and a charge distribution on a wafer is measured by a surface potential measurement (Step S202). Thereafter, movement to a position Pk where a pattern size is to be measured is conducted (Step S203) Then, the charge is removed based on a charge potential obtained by the surface potential measurement (Step S204). After the charge is removed, an SEM image is acquired (Step S205), and the image is stored (Step S206). Thereafter, if a pattern whose length is to be measured remains, the process from Step S203 to Step 206 is repeated (Step S208). If such a pattern does not remain, the critical dimension measuring sequence is terminated (Step S207).

Next, FIG. 20B shows a sequence where a charge distribution is acquired prior to start of pattern length measurement and the length measurement is performed after the charge is removed.

As shown in FIG. 20B, first, a critical dimension measuring sequence starts (Step S201), and a charge distribution on a wafer is measured by a surface potential measurement (Step S202). Thereafter, the charge on a whole surface of a wafer is removed (Step S204). After the charge is removed, movement to a position Pk where a pattern size is to be measured is conducted (Step S203), an SEM image is acquired (Step S205), and the image is stored (Step S206). Thereafter, if a pattern whose length is to be measured remains, the process from Step S204 to Step 206 is repeated (Step S208), but if such a pattern does not remain, the critical dimension measuring sequence is terminated (Step S207).

As shown in the fifth embodiment, by irradiating ultraviolet light on a wafer in the sample preparation chamber 70, such an effect can be obtained that contamination hardly adheres to a wafer during the measurement using electron beams.

Therefore, according to the electron microscope application apparatus and the sample inspection method of the embodiments, charges on a sample surface can be controlled rapidly and with high precision. Also, when the embodiments are applied to a measurement apparatus for a semiconductor wafer, the charges on a wafer surface can be always made uniform. Therefore, high precision measurement and high reproducibility can be realized. Further, when the embodiments are applied to an SEM type inspection apparatus, since a pattern formed on a wafer surface can be charged to a desired potential, electrical characteristic failure can be detected with high sensitivity.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to a production and inspection equipment for industrial products such as semiconductor devices.

What is claimed is:

1. An electron microscope application apparatus, comprising:
   means for irradiating ultraviolet light to an electrode provided above a sample and said sample and controlling incidence of photoelectrons generated from said electrode and said sample by utilizing electric field applied between said electrode and said sample,
   wherein charges of said sample can be set to an arbitrary potential.

2. An electron microscope application apparatus, comprising:
   an electrode disposed above a sample and having at least one hole; and
   an ultraviolet light source for irradiating ultraviolet light to said sample and said electrode,
   wherein said ultraviolet light is irradiated on said sample through at least said hole in the electrode.

3. The electron microscope application apparatus according to claim 2,
   wherein said electrode is formed in a mesh shape, and said ultraviolet light is irradiated to said sample through holes in the mesh.

4. The electron microscope application apparatus according to claim 2, further comprising:
   means for controlling incidence of photoelectrons generated from said electrode and said sample by utilizing electric field applied between said electrode and said sample.

5. The electron microscope application apparatus according to claim 2,
   wherein, in order to control charges of said sample, a wavelength of said ultraviolet light is 177 nm or shorter, and said sample is a semiconductor wafer during manufacturing process.

6. The electron microscope application apparatus according to claim 2,
   wherein compound with high quantum efficiency is deposited on said electrode.

7. A sample inspection method, comprising the steps of:
   irradiating ultraviolet light to an electrode disposed above a sample and said sample;
   controlling incidence of photoelectron generated from said electrode and said sample to said sample by utilizing electric field applied between said electrode and said sample; and
   setting charges of said sample to an arbitrary potential.

8. The sample inspection method according to claim 7,
   wherein said electrode is formed in a mesh, and said ultraviolet light is irradiated to said sample through holes in the mesh.

9. The sample inspection method according to claim 8,
   wherein a negative voltage relative to said sample is applied to said electrode, and an electric field for pulling photoelectrons emitted from said electrode back to said sample is generated,
   said ultraviolet light is irradiated through the holes in the mesh of said electrode, and
   said sample is negatively charged by pulling the photoelectrons generated from said electrode back to said sample.

10. The sample inspection method according to claim 8,
    wherein a positive voltage relative to said electrode is applied to said electrode, and an electric field for pulling photoelectrons emitted from said sample up from said sample is generated,
    said ultraviolet light is irradiated through the holes in the mesh of said electrode, and
    said sample is positively charged by pulling the photoelectrons generated from said sample up from said sample.

11. The sample inspection method according to claim 7,
    wherein said electrode has a hole penetrating through an approximate center of the electrode, and
    said ultraviolet light is irradiated to said sample through said hole.

12. The sample inspection method according to claim 7,
    wherein compound with high quantum efficiency is deposited on said electrode.

13. The sample inspection method according to claim 7,
    wherein charges remaining in said sample are removed before or after a measuring process utilizing charged particles in a manufacturing process of said sample.

14. The sample inspection method according to claim 7,
    wherein, when a pattern on said sample is measured by forming an image through charged particle beam scanning, said ultraviolet light is irradiated to said sample in intervals between scans of charged particle beam, and said image is acquired while removing charges in an observation region on said sample.

* * * * *